March 24, 1959 S. B. LUFTIG 2,879,385
LOGARITHMIC AMPLIFIER
Filed Feb. 2, 1955
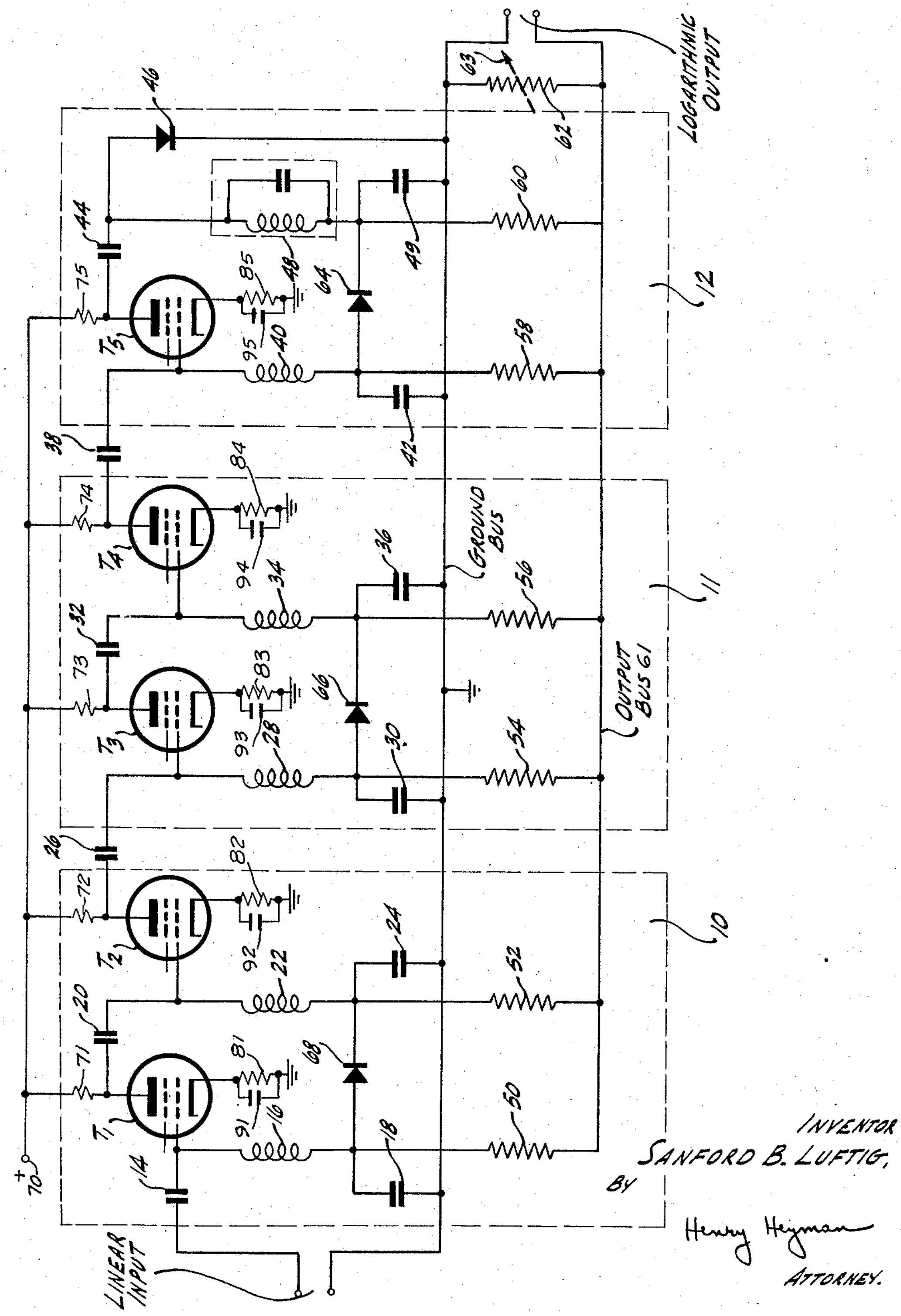
INVENTOR
SANFORD B. LUFTIG,
BY
Henry Heyman
ATTORNEY.

United States Patent Office 2,879,385
Patented Mar. 24, 1959

2,879,385

LOGARITHMIC AMPLIFIER

Sanford B. Luftig, Playa del Rey, Calif., assignor to Hughes Aircraft Company, Culver City, Calif., a corporation of Delaware Application February 2, 1955, Serial No. 485,769

4 Claims. (Cl. 250—27)

This invention relates to cascade amplifiers and more particularly to a cascaded logarithmic amplifier.

In many applications in the electronic art and in other related fields, it is desirable to have an amplifier, the output signal of which is proportional to the logarithm of the amplitude of the input signal, to thus provide an amplifier with a large dynamic range. Logarithmic amplifier circuits are known in the art with one type being disclosed in U.S. Patent No. 2,496,551, issued to James L. Lawson and Francis W. Martin on February 7, 1950. The prior art systems, however, fail to provide an accurate logarithmic output due to lack of control over the contribution of each stage to the "logarithmic" characteristic of the output signal.

It is, therefore, an object of the present invention to provide a logarithmic cascade amplifier which is not subject to such disadvantage of the prior art systems.

It is another object of this invention to provide a method of logarithmically amplifying signals which are not subject to the disadvantages of prior art systems.

It is a further object of this invention to provide such an amplifier having a very large dynamic range and having a very low level of non-logarithmic variation throughout the dynamic range.

The invention combines in the common load, through the individual grid coupling resistors, the detected output of successive amplifier stages. Detection is achieved in each stage by grid rectification and the contribution by each stage to the common load is controlled by selecting the value of the grid resistor. The detected output of one stage is also fed back as a D.-C. bias through the non-linear resistance characteristics of a diode to the grid of a preceding stage. When a relatively low level signal is applied to the input of the first stage, all stages operate in a normal linear manner and the only output contribution to the common load is from the final output stage. Further increase in the input signal level will produce rectified grid current in the final stage. Thus, grid current is drawn through the common load thereby contributing to the output of the amplifier, and the same signal is also applied as a bias to the grid of the output stage through a non-linear diode. Further increases in input signal level cause a similar detection action to occur on successively earlier stages. The contribution of each individual stage is thus fed to the common output resistor and the proportion contributed by each stage is governed by the value of its grid resistor feeding the common load. The amplifier maintains its logarithmic characteristic until the input signal level has increased to the point where the earliest diode controlled stage begins to saturate. The dynamic range of logarithmic operation of the amplifier is determined by the number of diode controlled pairs of stages in the amplifier. When the input signal level is increased to the point that the first stage is drawing grid current and contributing to the logarithmic output, there is no further extension of the dynamic range of the amplifier. The position and amplitude in the overall logarithmic response curve of the contribution of the individual or adjacent pairs of stages may be adjusted by means of varying the grid resistor or the non-linear diodes so as to effect the desired logarithmic output.

The novel features both as to organization and method of operation of the invention, together with further objects and advantages thereof, will be more fully understood from the following description of structure and operation considered in connection with the accompanying drawing made a part of the specification.

In the drawing, the figure is a schematic diagram of five typical stages in a logarithmic amplifier, according to this invention.

Referring now to the figure in which an example of the invention is shown as utilized in an intermediate frequency amplifier, dotted lines 10 and 11 enclose typical diode controlled pairs of stages. Dotted line 12 encloses the output stage. Vacuum tubes $T_1$ through $T_5$ are conventional intermediate frequency amplifier tubes and receive their electrode supply voltages in a normal manner. The plates of the vacuum tubes $T_1$ through $T_5$ are connected to a positive terminal 70 by way of the plate load resistors 71 to 75, respectively. An input signal to be amplified is impressed upon the grid of vacuum tube $T_1$ through input capacitor 14. The grid of tube $T_1$ is returned to ground through grid coil 16 and by-pass capacitor 18. Grid coil 16 is not coupled directly to ground in order that D.-C. voltages may be present at the junction of coil 16 and capacitor 18. The signal output of tube $T_1$ is impressed through coupling capacitor 20 to the grid of vacuum tube $T_2$, which is returned to ground through grid coil 22 and by-pass capacitor 24. In the same manner, the output signal of tube $T_2$ is impressed through coupling capacitor 26 to the grid of vacuum tube $T_3$. The grid of tube $T_3$ is likewise returned to ground through grid coil 28 and by-pass capacitor 30. The output signal of tube $T_3$ is impressed through coupling capacitor 32 to the grid of tube $T_4$, which grid is also returned to ground through grid coil 34 and by-pass capacitor 36. The output signal of tube $T_4$ is impressed through coupling capacitor 38 to the grid of output tube $T_5$, which grid is also returned to ground through grid coil 40 and by-pass capacitor 42. The output signal of tube $T_5$ is coupled through capacitor 44 to output detector 46, the cathode of which is connected to ground. The plate of detector 46 is coupled to tank circuit 48, the opposite terminal of which is by-passed to ground by capacitor 49. The cathode of each amplifier tube is returned to ground in a conventional manner. The cathodes of the vacuum tubes $T_1$ to $T_5$ are connected to ground potential by way of resistors 81 to 85 and by-pass capacitors 91 to 95 which are connected in parallel, respectively.

Grid coupling resistor 50 is coupled to the junction of grid coil 16 and capacitor 18; grid coupling resistor 52 is coupled to the junction of coil 22 and capacitor 24; grid coupling resistor 54 is coupled to the junction of coil 28 and capacitor 30; grid coupling resistor 56 is coupled to the junction of coil 34 and capacitor 36; grid coupling resistor 58 is coupled to the junction of coil 40 and capacitor 42; and coupling resistor 60 is coupled to the junction of tank circuit 48 and capacitor 49. The remaining terminals of resistors 50, 52, 54, 56, 58 and 60 are coupled to output bus 61, which is connected to output resistor 62; the opposite terminal of which is grounded. Thus, grid current drawn through any of the six coupling resistors will be additively drawn through output resistor 62.

Dotted arrow 63 indicates that output resistor 62 may be controllable over a predetermined range of resistance values.

A conventional non-linear diode 64 is coupled between the junction of circuit 48 and capacitor 49, i.e., the bottom of circuit 48, and the junction between coil 40 and capacitor 42, i.e., the bottom of coil 40, in a manner to conduct a negative bias voltage to the grid return of output tube $T_5$. Non-linear diode 66 is, in the same manner, coupled between the bottoms of coil 34 and coil 28 and, in the same manner, non-linear diode 68 is coupled between the bottoms of coil 22 and coil 16.

Referring again to the drawing, for the purposes of description of operation of the invention, it is seen that when a signal of a relatively low level is impressed upon input capacitor 14, vacuum tube $T_1$ amplifies in a conventional manner and no grid current is drawn through grid coupling resistor 50. Thus, in this condition, there is no contribution from the first stage to the output signal appearing across output resistor 62. The same is true of the second, third, and fourth stages if the input signal is sufficiently low so that none of these tubes draws grid current; and the only contribution to the total output signal is through the output circuit of tube $T_5$. This output signal is rectified by detector 46 and coupled through tank circuit 48, coupling resistor 60, and thence through output resistor 62. Capacitor 49 by-passes any A.-C. component present in the output signal to ground. As the input signal impressed upon capacitor 14 is increased, the signal occurring at the grid of output tube $T_5$ is accordingly increased and tube $T_5$ begins to draw grid current, which is drawn through coupling resistor 58, thus contributing to the output signal current drawn through output resistor 62. When a signal is applied to the grid of tube $T_1$, diode 64 couples the negative signal occurring at its cathode to the grid return of tube $T_5$ to reduce the gain of tube $T_5$ during that portion of the dynamic range of the amplifier in which tube $T_5$ would produce a non-logarithmic variation in the overall response curve. As the input signal impressed upon capacitor 14 is increased still further, tube $T_4$ begins to draw grid current through grid coupling resistor 56, thus making its contribution to the signal appearing across output resistor 62. The signal consequently appearing at the cathode of diode 66 is applied through diode 66 to the grid return of tube $T_3$ to make its contribution through resistor 54 to the output logarithmic. In the same manner, as the input signal is increased further, tube $T_2$ begins to draw grid current through coupling resistor 52 and a negative bias signal is applied through diode 68 to the grid return of the input tube $T_1$, thus causing its contribution to be logarithmic. As the input signal is increased more and more, the amplifying tubes starting with $T_5$ begin to saturate in reverse order until $T_1$ is finally saturated, at which point the upper limit of the dynamic range of the amplifier is reached.

There is shown in the drawing two typical diode controlled pairs of stages 10 and 11 preceding an output stage 12. The magnitude of the dynamic range of the amplifier is determined by the number of such typical diode controlled pairs of stages. Any number may be utilized, each stage contributing to the output by virtue of the grid current being drawn which provides a negative bias signal which is fed back to the previous tube for controlling the gain of the previous stage. The value of the grid coupling resistor of each stage determines the magnitude of signal contributed to the output signal by each particular stage. It is this feature, plus the lack of interdependence between pairs such as 10 and 11, which allows in this invention exact control of the logarithmic output characteristic of the whole amplifier.

When the value of the common output resistor 62 is changed, there is a corresponding shift in the overall response curve; i.e., the amplifier response curve is thus caused to be shifted parallel to itself without changing its logarithmic characteristics or changing the magnitude of the dynamic range.

It may further be seen upon inspection that the advantages achieved in this invention may be obtained with relatively simple modification to conventional cascade amplifiers. One need only insert non-linear diodes, such as diodes 64, 66 and 68, detach from ground the grid returns of the individual tubes, and couple each grid to the common load by means of resistors, such as grid coupling resistors 50 and 52.

What is claimed is:

1. A cascaded logarithmic amplifier comprising: a plurality of amplifying stages having control grids capable of carrying grid current and being conventionally connected in cascade; a plurality of non-linear diodes, adjacent pairs of said stages being further interconnected by the interposition of one of said diodes between said grids of each of said stages within said pairs of stages to provide feedback within each of said pairs of stages; a variable common output resistor; a plurality of grid coupling resistors each connected between one of said control grids and said variable common output resistor in a manner combining in said output resistor the grid currents of said stages.

2. A cascaded logarithmic amplifier comprising: a plurality of cascaded amplifying stages having control grids and grid coils connected thereto; a plurality of grid coupling resistors connected to said grid coils, said stages being adapted to draw grid current through said grid coupling resistors and grid coils; a common output resistor connected to each of said grid coupling resistors and being adapted to combine in said common resistor all the individual grid currents; a plurality of non-linear diodes connected between adjacent stages within adjacent pairs of stages each pair comprising one earlier and one later stage of said cascaded amplifier; the stages connected so that within each of said pairs a negative bias signal is conducted which is impressed through said non-linear diode upon the earlier stage within each of said pairs of stages to provide automatic control of the gain of alternate stages throughout said amplifier.

3. A multistage cascaded amplifier of the character adapted to provide an output amplitude response characteristic which is a predetermined function of the input signal comprising: a plurality of pairs of amplifying stages connected in cascade, each of said stages having a control grid; a non-linear diode connected in a feedback arrangement between the stages of each of said pairs of amplifying stages; a common output load resistor connected to supply grid current to each of said control grids; and grid resistors coupling the grid of each stage to said common output load resistor, whereby said output signal across said common output load resistor has a characteristic in relation to said input signal as determined by said grid resistor and nonlinear characteristics of said diodes.

4. A logarithmetic signal amplifier comprising: *n* pairs of amplifier stages connected in cascade, each containing a first and second stage; *n* non-linear diodes connecting the output of each second stage to the input of each of said first stage to provide a feedback signal within each of said amplifying stages; a variable common output resistor, said output resistor being variable to provide arbitrary shifting of the dynamic range of the amplifier; and 2 *n* grid coupling resistors, one of said grid resistors being coupled between each stage of the amplifier and said common output resistor.

References Cited in the file of this patent

UNITED STATES PATENTS

| | | |
|---|---|---|
| 2,480,201 | Selove | Aug. 30, 1949 |
| 2,774,825 | Sherr | Dec. 18, 1956 |

FOREIGN PATENTS

| | | |
|---|---|---|
| 291,387 | Switzerland | Sept. 16, 1953 |

OTHER REFERENCES

PB-121485, U.S. Dept. of Commerce, Office of Technical Services.

This is a reprint of "A New Type Instantaneous Logarithmic Wide Band Amplifier," from Technische Mitteilunger PTT, No. 5, 1951, 7 pages. Author is: G. Epprecht, Bern.